Jan. 24, 1950

H. BLOK ET AL 2,495,624

RADIO RECEIVER WITH BAND-SPREAD TUNABLE CIRCUITS

Filed Feb. 8, 1947

INVENTOR
HENRICUS ANDRIANUS BROOS
HENRI BLOK
BY Fred M Vogel
AGENT

Patented Jan. 24, 1950

2,495,624

UNITED STATES PATENT OFFICE 2,495,624

RADIO RECEIVER WITH BAND-SPREAD TUNABLE CIRCUITS

Henri Blok and Henricus Adrianus Broos, Eindhoven, Netherlands, assignors to Hartford National Bank and Trust Company, Hartford, Conn., as trustee Application February 8, 1947, Serial No. 727,346
In the Netherlands March 16, 1944

Section 1, Public Law 690, August 8, 1946
Patent expires March 16, 1964

7 Claims. (Cl. 250—40)

This invention relates to a radio-receiver, of which one or more resonant circuits can be tuned, through the intermediary of a tuning reactance, with bandspread in at least one short-wave range and without bandspread in one or more other wave ranges.

In the common receivers of this kind several comparatively narrow wave bands in the range of the short waves, which may be deemed to be of particular importance e. g. the broadcast bands or the amateur bands and which will be called "short wave bands" hereinafter, are spread out through-out the width of the dial scale. In order that the same tuning condenser may be used as in tuning in the long and medium wave range, one or more fixed condensers are connected in series and/or in parallel with the variable condenser in band-spread tuning.

The short wave bands to be spread having a width of 300 kilocycles/sec. at the most, the slope of the tuning curve indicating the tuning frequency as a function of the point of the hand with respect to the scale, is much smaller than the slope on tuning in the medium wave range. This has the drawback that small shortcomings of the receiver, such as frequency variations of the local oscillator, play of the tuning means or the like are manifest in an annoying manner. Moreover, the wave length switch must have an additional position for reception of the whole of the short wave range to permit of tuning also to ranges in between the short-wave bands.

The invention has for its object to ensure a suitable tuning to short waves by simple means, in which one or more short wave bands are spread to a sufficient degree and the ranges beyond these short-wave bands can be received without the need for special means, whilst the aforesaid drawbacks are avoided.

According to the invention, on tuning in a short-wave range a fixed reactance is connected in series and/or in parallel with the variable tuning reactance, the fixed reactance having such a size that, in the case of a complete variation of the tuning reactance, at least one short-wave band and in addition a range of waves in between the short-wave bands having a width corresponding at least to the distance between two neighbouring short wave bands, is covered, at least one short-wave band being spread.

The invention is based on the recognition that by the said series and/or parallel connection not only the range of variation of the tuning reactance and consequently the average slope of the tuning curve is reduced, but also the slope of the tuning curve at one or more points is so slight as to permit a short-wave band to be spread at these points. The said points with a flat form of the tuning curve are mostly located at the beginning or at the end of the wave range covered. The position of these points depends on the choice of the series and/or parallel reactance and on the variation of the tuning reactance as a function of the position of the dial pointer with respect to the scale. In conjunction herewith it is desirable that the short waves to be received should be distributed among a certain number of wave ranges in such a manner that each wave range comprises only two or at the most three short-wave bands.

The tuning to short waves can still be materially improved by inserting in the resonant circuit, on tuning in a short-wave range, the aforesaid variable tuning reactance (principal tuning reactance) and in addition at least one other variable reactance (auxiliary reactance), which is mechanically coupled with the principal tuning reactance and whose variation takes place in such a manner as to spread at least two short-wave bands. Owing to the mechanical coupling the principal tuning reactance and the auxiliary tuning reactance are varied by means of a common tuning device; however, the variation of these reactances need not always take place simultaneously. In contradistinction thereto, it may be desirable to vary the said reactances in succession or alternately.

When the short waves to be received are distributed among at least two short wave ranges, the aforesaid auxiliary tuning reactance may also be used to ensure a suitable closing up of the short wave ranges.

The principal tuning reactance and the auxiliary tuning reactance, on tuning in a short wave band, are preferably varied in opposite sense and are variable in the same sense at one or more points beyond the short wave bands.

In order that the invention may be clearly understood and readily carried into effect, it will now be explained more fully by reference to the accompanying drawing, representing, by way of example, several embodiments thereof.

Figure 1:
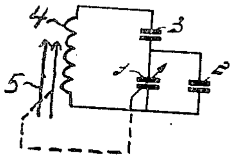
Figure 1 represents a preferred embodiment of the invention.

Fig. 1 represents a resonant circuit which constitutes, for instance, the oscillator circuit of a radio receiver according to the invention and is shown in the circuit arrangement used in tuning in a short wave range. The resonant circuit includes a variable condenser 1 with which a fixed condenser 2 is connected in parallel, and in series with this parallel-connection is provided a fixed condenser 3 and an inductance coil 4 whose inductance can be varied by means of a movable core 5 of ferromagnetic or conducting material. In practice good results are obtained when making use of a copper core. The inductance variation to be obtained by shifting the core may, for instance, amount to from 20 to 30% of the maximum value. The tuning condenser 1 and the core 5 are mechanically intercoupled and are controlled by a common tuning device. The displacement of the core may, for instance, be derived from the shaft of the tuning condenser by means of a variable coupling, e. g. a cam disc. However, the desired variation of the inductance can also be obtained when making use of a composite core which consists partly of iron and partly of copper and whose displacement is derived through a direct coupling from the shaft of the tuning condenser. After changing over the resonant circuit the tuning condenser 1 is used at the same time for tuning the receiver in the long and medium wave range.

Figure 2:
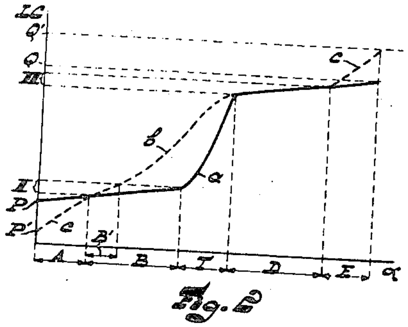
Fig. 2 illustrates graphically the operation of the circuit shown in Fig. 1.

Fig. 2 illustrates the product LC of the inductance of coil 4 and the capacity connected in parallel with the coil as a function of the position $\alpha$ of the dial pointer with respect to the dial scale, the points of two short wave bands to be spread being designated by I and II along the ordinate axis.

By a suitable size of the condensers 2 and 3 and a suitable variation of the inductance of coil 4 it can be ensured that the product LC varies as a function of the position of the dial pointer according to curve *a*, the short wave band I being spread out over the dial scale part designated by B and the short wave band II over the dial scale part D. In between these parts there is a range T, in which no spreading takes place and in which the slope of the tuning curve may substantially correspond with that in the case of the short wave range being covered from 13 to 50 m. without changing over and without making use of bandspread. The condensers 2 and 3 and the variation of the inductance are preferably so chosen that the spread of the short-wave band II is mainly brought about by the condenser 3, and the spread of the short wave band I mainly by the variation of the inductance of coil 4. Furthermore Fig. 2 shows (see curve *b*) how the product LC would vary if the inductance of coil 4 were kept constant. Thereby the spreading of the short wave band II having the greatest wave length is not or substantially not affected, but the short wave band I having the smallest wave length is spread out over a materially smaller range B', whereas the slope of the tuning curve in the range T in between the bands has slightly decreased.

In principle it is also feasible, by a suitable choice of the condensers 2 and 3, to secure a sufficient spreading of the two short wave bands without variation of the inductance of coil 4. The use of the inductance variation has the advantage, that the slope of the tuning curve in the various parts of the short wave range can be adjusted entirely at will. Moreover, the inductance variation may be utilised to ensure a suitable closing up of the short wave ranges, among which the short waves to be received are distributed.

In the aforesaid circuit arrangement, in effect, the product LC is very flat at the beginning and the end of each short wave range (ranges A and E in Fig. 2), and the more flat as the spreading in the short wave bands is better. As a result, tuning may not be possible in the range between two short wave bands which occur in different short wave ranges, because the various short wave ranges do not adjoin each other.

This evil can be cured by varying the inductance of coil 4 in the range A and/or in the range E in a suitable manner, e. g. in such a manner that the product LC varies according to the curve *c*, which coincides with the curve *a* in the ranges B, T and D, but exhibits a much steeper slope in the areas A and E. Such a variation can be obtained by making the inductance of coil 4, on traversing the area A, gradually increase in the direction of range B, e. g. by moving an iron core entirely or partly into the coil. After that the inductance of coil 4 is caused to decrease again, and in the area T is brought about an increase, in the area D a decrease and in the area E again an increase of the inductance. As the case may be the inductance in the area D may be kept constant. The short wave range, which is covered when no inductance variation is used in the ranges A and E is represented by PQ in Fig. 2. When using the said inductance variation this range is widened to P'Q', as a result of which the short wave ranges, among which the short waves to be received are distributed, adjoin or even overlap each other.

Figure 3:
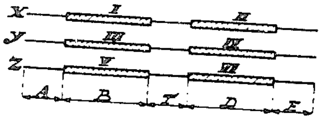
Fig. 3 and 4 show alternative arrangements of a receiver dial scale as referring to the band spreads graphically represented in Fig. 2.
Figure 4:
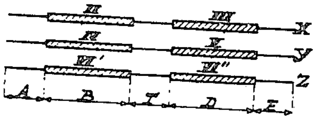

Fig. 3 illustrates how the short wave bands can be provided on the scales of the various short wave ranges, the short wave bands I (13 m.) and II (16 m.) appearing on scale X, the short wave bands III (20 m.) and IV (25 m.) figuring on scale Y and the short wave bands V (30 m.) and VI (40 to 50 m.) appearing on scale Z. If desired, the short wave bands may also be arranged in such a manner as to spread the 40 m. band and the 50 m. band each individually, whereas in the 13 m. band tuning takes place without bandspread. This arrangement is shown in Fig. 4, wherein the figures II to V denote the same bands as in Fig. 3, VI' designating the 40 m. band and VI'' denoting the 50 m. band. In a particularly suitable executional example the widths of the various ranges on the dial scale are so chosen that $B=D=A+T+E$. If this condition be satisfied, the slope of the tuning curve in the short wave bands substantially corresponds to or is slightly smaller than that in the medium wave range, whereas the slope for the remaining dial scale parts is the same as when the short wave range of from 13 to 50 m. were covered without changing over and without making use of band-spread. If desired all bands on the dial scale may be given the same width by using a separate coil for each short wave range, so that the inductance variation as a function of the position of the dial pointer with respect to the scale can be adjusted separately for each short wave range.

Figure 5:
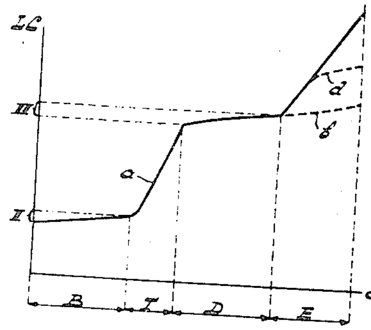
Fig. 5 represents a further graphical illustration of the circuit shown in Fig. 1.

Fig. 5 represents the tuning curve of another embodiment of the invention, in which the first short wave band I is at the beginning of the dial scale (range B), and the second short wave band II begins before the middle of the dial scale (range D). In this case the spreading of the first short wave band is mainly obtained by means of the parallel condenser 2 and the spreading of the second short-wave band mainly by means of the series-condenser 3. If in this case the inductance of coil 4 were kept constant, the product LC would initially vary according to curve *a* and then according to curve *b*, due to which closing up or overlapping of the various short-wave ranges would not be ensured. To avoid this drawback the inductance of coil 4 in the range E at the end of the dial scale is varied in such a manner that an increase in capacity of the condenser 1 involves an increase in inductance of coil 4. In this case the tuning curve shows a much steeper slope in range E, which yields the desired closing up or overlapping.

Figure 6:
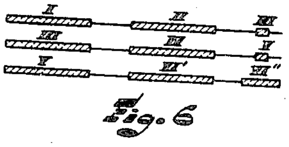
Fig. 6 shows a receiver dial scale for the graphical representation shown in Fig. 5.

Fig. 6 shows how in this case the various short-wave bands can be provided on the dial scales. The separate spreading of the short wave bands VI′ and VI′′ can then be obtained by causing the inductance, in the short-wave range corresponding with dial scale Z, to increase less strongly at the end of the dial scale, so that the variation of the product LC in this range is represented by the curve *d*. Of course, the variation of the inductance of coil 4 need not be confined to range E, since it can also be used in the other ranges for improving the band-spread.

Figure 7:
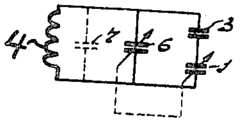
Fig. 7 shows a further embodiment of the invention.

Instead of the variation of the inductance of coil 4, the desired variation of the tuning curve may also be obtained by means of a special condenser 6 (correcting condenser), which may be connected in parallel with coil 4, as is shown in Fig. 7. In this case the zero capacity of the circuit, which may be increased by parallel-connection of a fixed condenser, is designated 7. The tuning condenser 1 and the correcting condenser 6 are mechanically intercoupled and are controlled by a common tuning device.

Figure 8:
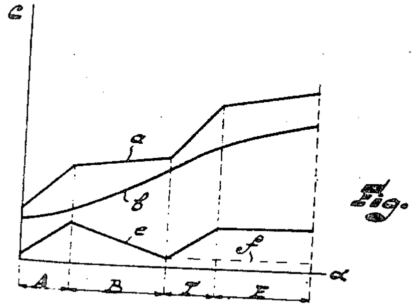
Fig. 8 shows graphically the operation of the circuit shown in Fig. 7.

In Fig. 8 the curve *a* represents the variation of the total capacity C of the condensers connected in parallel with coil 4 as a function of the position of the dial pointer with respect to the dial scale, curve *b* representing the variation obtained when switching off the correcting condenser 6, and the curve *c* representing the capacity variation of the condenser 6. The maximum capacity of the correcting condenser may be comparttively low, e. g. 40 to 50 pf. In certain circumstances the parts of the circuit may be given such a size that the short-wave band at the end of the dial scale is spread to a sufficient degree without variation of the correcting condenser. In this case the capacity of the correcting condenser 6 may also vary according to curve *f*. When equipping the correcting condenser with two or more stators, each of which act in a different short-wave range, the desired capacity variation can be obtained in each short-wave range.

What we claim is:

1. A resonant circuit arrangement to provide band-spreading for radio receivers comprising, a first capacitive element, a second capacitive element in series with said first capacitive element, a third capacitive element, means to connect said third capacitative element in parallel with a portion of the series connection of said first and second capacitive elements, an inductive element connected in parallel with the said series connection of the first and second capacitive elements, means to make variable in magnitude two of the aforesaid circuit elements, and means to mechanically couple the said variable circuit elements and to vary the value of said variable circuit elements at a given rate relative to each other over a first portion of the tuning range of said elements and at a rate different from said given rate relative to each other over a second portion of the tuning range of said elements.

2. A resonant circuit arrangement to provide band-spreading for radio receivers comprising, a variable capacitive element, a first fixed capacitive element in parallel with said variable capacitive element, a second fixed capacitive element connected in series with said variable capacitive element, a variable inductive element connected in parallel with the said series connection of the variable capacitive element and the second fixed capacitive element, and means to mechanically couple said variable capacitative element and said variable inductive element and to vary the values of said variable elements at a given rate relative to each other over a first portion of the tuning range of said elements and at a rate different from said given rate relative to each other over a second portion of the tuning range of said elements.

3. A resonant arrangement to provide band-spreading for radio receivers comprising, a variable capacitive element, a first fixed capacitive element in parallel with said variable capacitive element, a second fixed capacitive element connected in series with said variable capacitive element, a variable inductive element having a movable core of ferromagnetic material and connected in parallel with the said series connection of the variable capacitive element and the second fixed capacitive element, and means to mechanically couple said variable capacitative element and said variable inductive element and to vary the value of said variable elements at a given rate relative to each other over a first portion of the tuning range of said elements and at a rate different from said given rate relative to each other over a second portion of the tuning range of said elements.

4. A resonant circuit arrangement to provide band-spreading for radio receivers comprising, a variable capacitive element, a first fixed capacitive element in parallel with said variable capacitive element, a second fixed capacitive element connected in series with said variable capacitive element, a variable inductive element having a movable core of electrically conductive material and connected in parallel with the said series connection of the variable capacitive element and the second fixed capacitive element, and means to mechanically couple said variable capacitative element and said variable inductive element and to vary the value of said variable elements at a given rate relative to each other over a first portion of the tuning range of said elements and at a rate different from said given rate relative to each other over a second portion of the tuning range of said elements.

5. A resonant circuit arrangement to provide band-spreading for radio receivers comprising, a variable capacitive element, a fixed capacitive element in parallel with said variable capacitive element, a variable inductive element connected in parallel with the said variable capacitive element and the said fixed capacitive element, and means to mechanically couple said variable capacitative element and said variable inductive element and to vary the value of said variable elements at a given rate relative to each other over a first portion of the tuning range of said elements and at a rate different from said given rate relative to each other over a second portion of the tuning range of said elements.

6. A resonant circuit arrangement to provide band-spreading for radio receivers comprising, a variable capacitive element, a fixed capacitive element connected in series with said variable capacitive element, a variable inductive element connected in parallel with the said series connection of the variable capacitive element and the fixed capacitive element, and means to mechanically couple said variable capacitative element and said variable inductive element and to vary the value of said variable elements at a given rate relative to each other over a first portion of the tuning range of said elements and at a rate different from said given rate relative to each other over a second portion of the tuning range of said elements.

7. A resonant circuit arrangement to provide band-spreading for radio receivers comprising, a first variable capacitive element, a fixed capacitive element in series with said variable capacitive element, a second variable capacitive element connected in parallel with said series connection of the first variable and fixed capacitive element, an inductive element connected in parallel with the said second variable capacitive element, and means to mechanically couple said first and second variable capacitative elements and to vary the value of said variable capacitative elements at a given rate relative to each other over a first portion of the tuning range of said elements and at a rate different from said given rate relative to each other over a second portion of the tuning range of said elements.

HENRI BLOK.
HENRICUS ADRIANUS BROOS.

REFERENCES CITED

The following references are of record in the file of this patent:

UNITED STATES PATENTS

| Number | Name | Date |
|---|---|---|
| 2,095,035 | Posthumus et al. | Oct. 5, 1937 |
| 2,129,026 | Van Roberts | Sept. 6, 1938 |
| 2,288,236 | Green | June 30, 1942 |
| 2,312,211 | De Cola | Feb. 23, 1943 |

FOREIGN PATENTS

| Number | Country | Date |
|---|---|---|
| 38,349 | Holland | May 16, 1936 |
| 551,064 | Great Britain | Feb. 5, 1943 |
| 552,403 | Great Britain | Apr. 6, 1943 |

OTHER REFERENCES

Wireless World for February 1940, pages 130–131. Copy in Div. 10.

Wireless World for November 17, 1938, pages 443–44. Copy in Div. 10.